(12) United States Patent
Beerens et al.

(10) Patent No.: US 12,007,693 B2
(45) Date of Patent: Jun. 11, 2024

(54) LASER FOCUSSING MODULE

(71) Applicants: ASML Netherlands B.V., Veldhoven (NL); Trumpf Lasersystems For Semiconductor Manufacturing GmbH, Ditzingen (DE)

(72) Inventors: Ruud Antonius Catharina Maria Beerens, Roggel (NL); Nico Johannes Antonius Hubertus Boonen, Geldrop (NL); Stefan Michael Bruno Bäumer, Eindhoven (NL); Tolga Mehmet Ergin, Bietigheim-Bissingen (DE); Andreas Kristian Hopf, Stuttgart (DE); Derk Jan Wilfred Klunder, Geldrop (NL); Martin Anton Lambert, Korb (DE); Stefan Piehler, Stuttgart (DE); Manisha Ranjan, Eindhoven (NL); Frank Bernhard Sperling, Nuenen (NL); Andrey Sergeevich Tychkov, Eindhoven (NL); Jasper Witte, Eindhoven (NL); Jiayue Yuan, Eindhoven (NL)

(73) Assignees: ASML Netherlands B. V., Veldhoven (NL); Trumpf Lasersystems For Semiconductor Manufacturing GmbH, Ditzingen (DE)

( * ) Notice: Subject to any disclaimer, the term of this patent is extended or adjusted under 35 U.S.C. 154(b) by 201 days.

(21) Appl. No.: 17/600,763

(22) PCT Filed: Apr. 3, 2020

(86) PCT No.: PCT/EP2020/059614
§ 371 (c)(1),
(2) Date: Oct. 1, 2021

(87) PCT Pub. No.: WO2020/201530
PCT Pub. Date: Oct. 8, 2020

(65) Prior Publication Data
US 2022/0206397 A1 Jun. 30, 2022

(30) Foreign Application Priority Data
Apr. 4, 2019 (EP) .................................. 19167261

(51) Int. Cl.
G03F 7/00 (2006.01)
H01S 3/00 (2006.01)
H05G 2/00 (2006.01)

(52) U.S. Cl.
CPC ........ *G03F 7/70033* (2013.01); *H01S 3/0071* (2013.01); *H05G 2/008* (2013.01)

(58) Field of Classification Search
CPC .... H05G 2/008; G03F 7/70033; H01S 3/0071
See application file for complete search history.

(56) References Cited

U.S. PATENT DOCUMENTS 6,727,981 B2 * 4/2004 Taniuchi ................. G03F 7/709
355/30
2005/0274897 A1 3/2005 Singer et al.
(Continued)

FOREIGN PATENT DOCUMENTS

JP 2012/173076 A 9/2012
WO WO2014/095261 A1 6/2014
(Continued)

OTHER PUBLICATIONS

International Search Report and Written Opinion of the International Searching Authority directed to related International Patent Application No. PCT/EP2020/059614, dated Aug. 19, 2020; 21 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

A laser focusing system (330) for use in an EUV radiation source is described, the laser focusing system comprising: •—a first curved mirror (330.1) configured to receive a laser beam from a beam delivery system (320) and generate a first reflected laser beam (316); •—a second curved mirror (330.2) configured to receive the first reflected laser beam (316) and generate a second reflected laser beam (317), wherein the laser focusing system (330) is configured to focus the second reflected laser beam (317) to a target location (340) in a vessel (350) of the EUV radiation source (360).

18 Claims, 10 Drawing Sheets

(56) References Cited

U.S. PATENT DOCUMENTS

| | | |
|---|---|---|
| 2011/0063598 A1 | 3/2011 | Fiolka et al. |
| 2011/0140008 A1 | 6/2011 | Bergstedt et al. |
| 2011/0255173 A1 | 10/2011 | Joobeur et al. |
| 2012/0147349 A1* | 6/2012 | Van Dijsseldonk ............... G03F 7/70033 250/504 R |
| 2015/0173164 A1 | 6/2015 | McKenzie et al. |
| 2016/0005588 A1 | 1/2016 | Park et al. |
| 2016/0195729 A1 | 7/2016 | Lambert |
| 2016/0198557 A1 | 7/2016 | Enzmann |
| 2017/0299857 A1 | 10/2017 | Kurosawa et al. |
| 2017/0317464 A1* | 11/2017 | Kurosawa ............. H01S 3/0071 |
| 2018/0175582 A1 | 6/2018 | Rothberg et al. |
| 2018/0199422 A1 | 7/2018 | Yabu |
| 2018/0231790 A1 | 8/2018 | Krauss et al. |
| 2018/0235064 A1 | 8/2018 | Yabu et al. |
| 2019/0293922 A1 | 9/2019 | Ito et al. |
| 2019/0313519 A1 | 10/2019 | Yabu et al. |

FOREIGN PATENT DOCUMENTS

| | | |
|---|---|---|
| WO | WO2018/131123 A1 | 7/2018 |
| WO | WO2018/138886 A1 | 8/2018 |

OTHER PUBLICATIONS

International Preliminary Report on Patentability, directed to related International Application No. PCT/EP2020/059614, dated Sep. 28, 2021; 13 pages.

Isaac Tobin, "Optical and EUV studies of laser triggered Z-pinch discharges," Oct. 2014, 196 pages, Trinity College, School of Physics, Dublin, Ireland.

Thomas Cummins, "Studies of extreme ultraviolet emission from laser produced plasmas, as sources for next generation lithography," Aug. 2013, 209 pages, University College Dublin, School of Physics, Dublin, Ireland.

Radhwan Alnaimi, "Development of a low-debris laser driven soft x-ray source for lithographic applications," Feb. 2016, 218 pages, Imperial College London, London, England.

EUV Drive Laser—TRUMPF Website (accessed Nov. 11, 2019 at https://www.trumpf.com/en_US/products/laser/euv-drive-laser/); 11 pages.

Benjamin Szu-Min Lin et al., "High power LPP EUV source system development status," Dec. 2009, 10 pages, Proc. SPIE 7520, Lithography Asia, Taipei, Taiwan.

* cited by examiner

LASER FOCUSSING MODULE

CROSS-REFERENCE TO RELATED APPLICATIONS

This application claims priority of EP application 19167261.7 which was filed on Apr. 4, 2019 and which is incorporated herein in its entirety by reference.

FIELD

The present invention relates to a laser focusing system as can be applied in an EUV radiation source. The present invention further relates to an EUV radiation source comprising a laser focusing system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \qquad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$ by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Possible sources include laser-produced plasma (LPP) sources, although other types of source are possible.

An example of current progress in the development of LPP sources for EUV lithography is described in the paper "High power LPP EUV source system development status" by Benjamin Szu-Min Lin, David Brandt, Nigel Farrar, SPIE Proceedings Vol. 7520, Lithography Asia 2009, December 2009 (SPIE Digital Library reference DOI: 10.1117/12.839488). In a lithographic apparatus, the source apparatus will typically be contained within its own vacuum housing, while a small exit aperture is provided to couple the EUV radiation beam into an optical system where the radiation is to be used.

In order to be useful in high-resolution patterning for lithography, the EUV radiation beam must be conditioned to obtain desired parameters such as uniformity of intensity and angular distribution, when it reaches the reticle. Examples of an illumination system are described in United States Patent Application Publication Nos. US 2005/0274897A1 (Carl Zeiss/ASML) and US 2011/0063598A (Carl Zeiss). The example systems include a 'fly's eye' illuminator which transforms the highly non-uniform intensity profile of the EUV source into a more uniform and controllable source.

In order to generate EUV radiation in an LPP radiation source, a laser or laser system is used to irradiate a target such as a Sn droplet. In particular, such an LPP radiation source may comprises one or more lasers for irradiating the target with one or more pre pulses and a main pulse to convert the target and generate the EUV radiation.

Typically, such a laser or laser system comprises a laser focusing system configured to focus a laser beam, e.g. a pre pulse laser beam or a main pulse laser beam, onto a target location inside a vessel of the LPP radiation source or EUV source. Known arrangements of such laser focusing system may be quite bulky and may generate a focused laser beam which does not have the desired optical properties for irradiating the target and thus effectively converting the target into EUV radiation.

SUMMARY

Aspects of embodiments of the present invention aim to provide an alternative laser focusing system for use in an EUV radiation source.

According to an aspect of the invention, there is provided a laser focusing system for use in an EUV radiation source, the laser focusing system comprising:
- a first curved mirror configured to receive a laser beam from a beam delivery system and generate a first reflected laser beam;
- a second curved mirror configured to receive the first reflected laser beam and generate a second reflected laser beam, wherein the laser focusing system is configured to focus the second reflected laser beam to a target location in a vessel of the EUV radiation source.

According to another aspect of the invention, there is provided a laser source comprising a laser focusing system according to the invention.

According to yet another aspect of the invention, there is provided an EUV radiation source comprising a laser source according to the invention.

According to yet another aspect of the invention, there is provided a lithographic apparatus comprising an EUV radiation source according to the invention.

These aspects of the invention and various optional features and implementations thereof will be understood by the skilled reader from the description of examples which follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
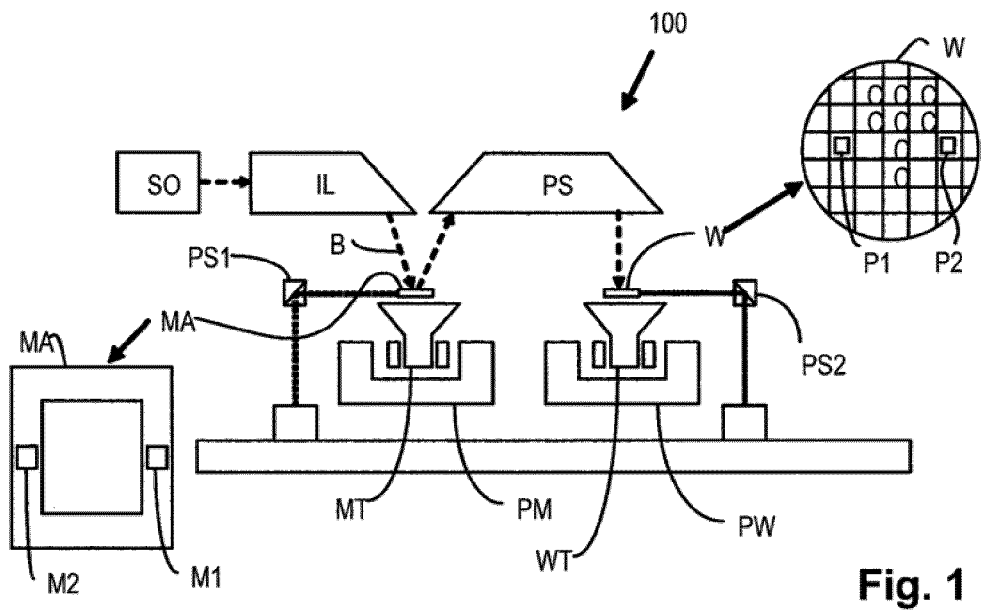
FIG. 1 depicts schematically a lithographic system according to an embodiment of the invention.

FIG. 1 schematically depicts a lithographic system 100 according to an embodiment of the present invention, the lithographic system comprising a lithographic apparatus and an EUV radiation source configured for generating EUV radiation, e.g. an EUV radiation beam. In the embodiment as shown, the EUV radiation source comprises a source collector module SO. In the embodiment as shown, the lithographic scanning apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO of the EUV radiation source. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the EUV radiation source may be separate entities, for example when a $CO_2$ laser is used to provide the laser beam for fuel excitation.

In such cases, the laser is not considered to form part of the lithographic system and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The embodiments to be illustrated involve scanning, as in the modes 2 and 3 just mentioned.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Figure 2:
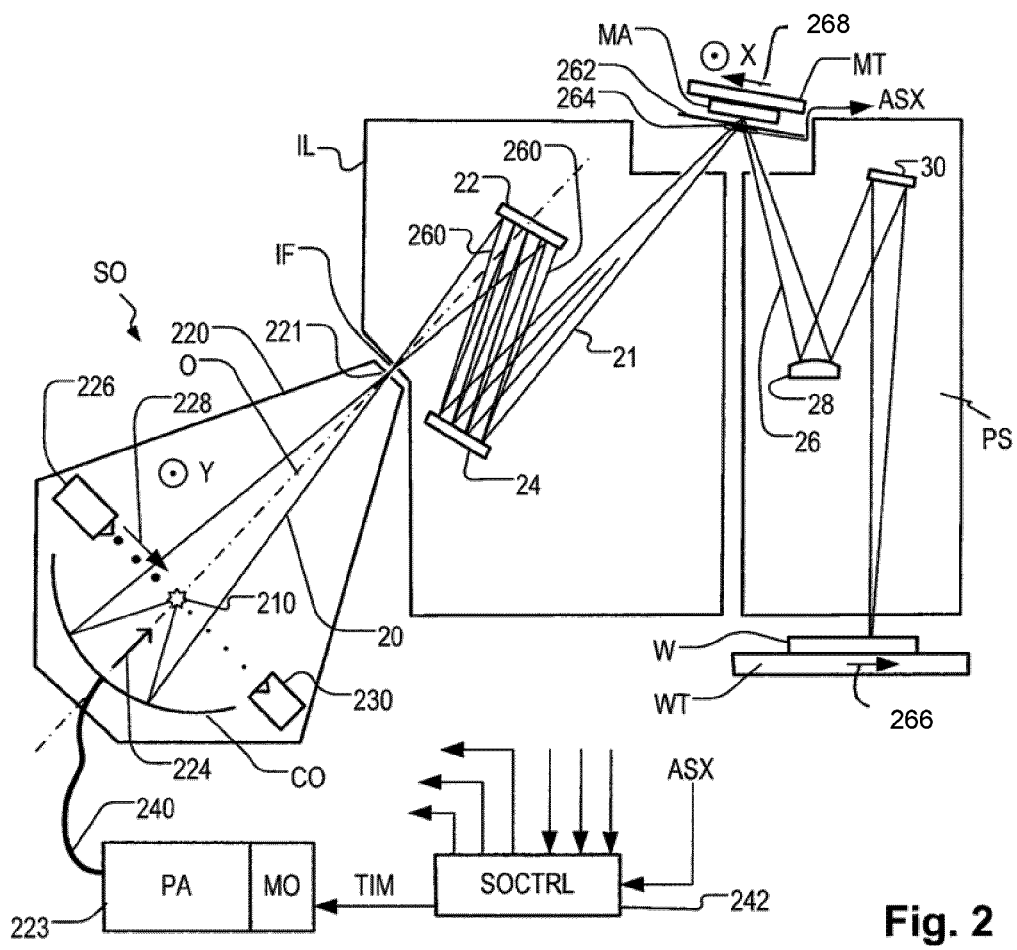
FIG. 2 depicts a more detailed view of the apparatus of FIG. 1.

FIG. 2 shows the system 100 in more detail, including the EUV radiation source comprising the source collector module SO and the lithographic scanning apparatus comprising the illumination system IL, and the projection system PS. The source collector module SO of the EUV radiation source is constructed and arranged such that a vacuum environment can be maintained in an enclosing structure 220 of the source collector module SO. The systems IL and PS are likewise contained within vacuum environments of their own. An EUV radiation emitting plasma 210 may be formed by a laser produced LPP plasma source. The function of source collector module SO is to deliver EUV radiation beam 20 from the plasma 210 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 210.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2. The United States patent application publications referred to above show three additional elements in the illumination system, for example.

Considering source collector module SO in more detail, laser energy source comprising laser 223 is arranged to deposit laser energy 224 into a fuel, such as xenon (Xe), tin (Sn) or lithium (Li), creating the highly ionized plasma 210 with electron temperatures of several 10's of eV. Higher energy EVU radiation ay be generated with other fuel materials, for example Tb and Gd. The energetic radiation generated during de-excitation and recombination of these ions is emitted from the plasma, collected by a near-normal incidence collector CO and focused on the aperture 221. The plasma 210 and the aperture 221 are located at first and second focal points of collector or collector mirror CO, respectively.

To deliver the fuel, which for example is liquid tin, a droplet generator 226 is arranged within the enclosure 220, arranged to fire a high frequency stream 228 of droplets towards the desired location of plasma 210. In operation, laser energy 224 is delivered in a synchronism with the operation of droplet generator 226, to deliver impulses of radiation to turn each fuel droplet into a plasma 210. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 210. A trap 230 is provided on the opposite side of the enclosing structure 220, to capture fuel that is not, for whatever reason, turned into plasma.

Numerous additional components in the source collector module and the lithographic apparatus are present in a typical apparatus, though not illustrated here. These include arrangements for reducing or mitigating the effects of contamination within the enclosed vacuum, for example to prevent deposits of fuel material damaging or impairing the performance of collector or collector mirror CO and other optics. Also, one or more spectral purity filters will be included in the source collector module SO and/or illumination system IL. These filters are for eliminating as much as possible radiation of unwanted wavelengths, that are generated by the laser and/or the plasma 210, in addition to the wanted wavelengths of the UV radiation. The spectral purity filter(s) may be positioned near the virtual source point or at any point between the collector and the virtual source point. The filter can be placed at other locations in the radiation path, for example downstream of the virtual source point IF. Multiple filters can be deployed. The skilled person is familiar with the need for these measures, and the manner in which they may be implemented, and further detail is not required for the purposes of the present disclosure.

Referring to laser 223 from FIG. 2 in more detail, the laser in the presented embodiment is of the MOPA (Master Oscillator Power Amplifier) type. This consists of a "master" laser or "seed" laser, labeled MO in the diagram, followed by a power amplifier (PA). A beam delivery system 240 is provided to deliver the laser energy 224 into the module SO. In practice, the pre-pulse element of the laser energy will be delivered by a separate laser, not shown separately in the diagram. Laser 223, fuel source (i.e. the droplet generator) 226 and other components may e.g. be controlled by a source control module 242.

As one of ordinary skill in the art will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream (228, described below), while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Referring in a little more detail to the illumination system, faceted field mirror device 22 comprises an array of individual facets, so that the EUV radiation beam 20 is divided into a number of sub beams, of which one is labeled 260 in the diagram. Each sub beam is directed towards an individual facet on the faceted pupil mirror device 24. The facets of pupil mirror device 24 are arranged to direct their individual sub beams onto a target which is a slit-shaped area of patterning device MA. The division into sub beams 260 and the combination into a single beam 21 is designed to create highly uniform illumination over the slit area, when the illumination arriving from the source collector module is highly non-uniform in its angular distribution. As is also known, the facets of the devices 22 and/or 24 may be steerable and/or maskable, in order to implement different illumination modes.

The conditioned EUV radiation beam 21 is delivered to patterning device MA through a conditioning and masking module 262. This module includes a masking unit, also referred to as the reticle mask (REMA) which may have movable blades defining the extent of an illumination slit in X and Y directions. Typically, the illumination slit as applied in EUV-type lithographic apparatuses may be curved.

In front of the REMA may also be an illumination uniformity correction module (UNICOM).

To expose a target portion C on substrate W, pulses of radiation are generated on substrate table WT and masked table MT perform synchronized movements 266, 268 to scan the pattern on patterning device MA through the slit of illumination.

Examples of illumination systems including REMA and UNICOM functions are described in United States Patent Application Publication Nos. 2005/0274897A1 and 2011/0063598A.

Many measures are applied in the source controller 242. Such measures include monitoring to ensure that the virtual source point IF is aligned with the aperture 221, at the exit from the source collector module SO. In systems based on LPP sources, control of alignment is generally achieved by controlling the location of the plasma 210, rather than by moving the collector optic CO. The collector optics, the exit aperture 221 and the illuminator IL are aligned accurately during a set-up process, so that aperture 221 is located at the second focal point of collector optic. However, the exact location of the virtual source point IF formed by the EUV radiation at the exit of the source optics is dependent on the exact location of the plasma 210, relative to the first focal point of the collector optics. To fix this location accurately enough to maintain sufficient alignment generally requires active monitoring and control.

For this purpose, source control module (controller) 242 in this example controls the location of the plasma 210 (the source of the EUV radiation), by controlling the injection of the fuel, and also for example the timing of energizing pulses from laser. In a typical example, energizing pulses of laser radiation 224 are delivered at a rate of 50 kHz (period 20 μs), and in bursts lasting anything from, say, 20 ms to 20 seconds. The duration of each main laser pulse may be around 1 μs, while the resulting EUV radiation pulse may last around 2 μs. By appropriate control, it is maintained that the EUV radiation beam is focused by collector CO precisely on the aperture 221. If this is not achieved, all or part of the beam will impinge upon surrounding material of the enclosing structure.

The source control module 242 is supplied with monitoring data from one or more arrays of sensors (not shown) which provide a first feedback path for information as to the location of the plasma. The sensors may be of various types, for example as described in Unites States Patent Application Publication No. 2005/0274897A1, mentioned above. The sensors may be located at more than one position along the radiation beam path. They may for example be located around and/or behind the field mirror device 22, purely for the sake of example. The sensor signals just described can be used for control of the optical systems of the illuminator IL and projection system PS. They can also be used, via feedback path, to assist the control module 242 of the source collector module SO to adjust the intensity and position of the EUV plasma source 210. The sensor signals can be processed for example to determine the observed location of the virtual source IF, and this is extrapolated to determine, indirectly, the location of the EUV source. If the virtual source location drifts, as indicated by the sensor signals, corrections are applied by control module 242 to re-center the beam in the aperture 221.

Rather than rely entirely on the signals from the illuminator sensors, additional sensors and feedback paths may generally be provided in the source collector module SO itself, to provide for more rapid, direct and/or self-contained control of the radiation source. Such sensors may include one or more cameras, for example, monitoring the location of the plasma. In this way the location beam 20 is maintained in the aperture 221, and damage to the equipment is avoided, and efficient use of the radiation is maintained.

The EUV radiation system as described above with reference to FIGS. 1 and 2 will typically include a laser or laser system, not shown in FIG. 1, for providing a laser beam that excites the fuel, e.g. a tin (Sn) droplet. Typically, the laser or laser system is configured to deliver laser energy in at least two pulses: a pre pulse with limited energy is delivered to the droplet before it reaches the plasma location, in order to vaporize the fuel material into a small cloud. A main pulse of laser energy is then delivered to the cloud at the desired location, to generate the plasma. The resulting plasma emits output radiation, e.g., EUV radiation, which is collected using a radiation collector, disposed in the source collector module.

In general, the laser system and the EUV radiation source may be separate entities, for example when a $CO_2$ laser is used to provide the laser beam for fuel excitation.

In such an arrangement, the laser system may e.g. comprise a laser source configured to generate the laser beam or beams, an optional laser beam delivery system configured to guide or direct the generated laser beam from the laser towards the EUV radiation source, and a laser focusing system that is configured to focus the laser beam onto a target, e.g. a tin droplet, inside a vessel of the EUV radiation source.

The present invention provides a laser focusing system which can be applied in such a laser system.

Figure 3:
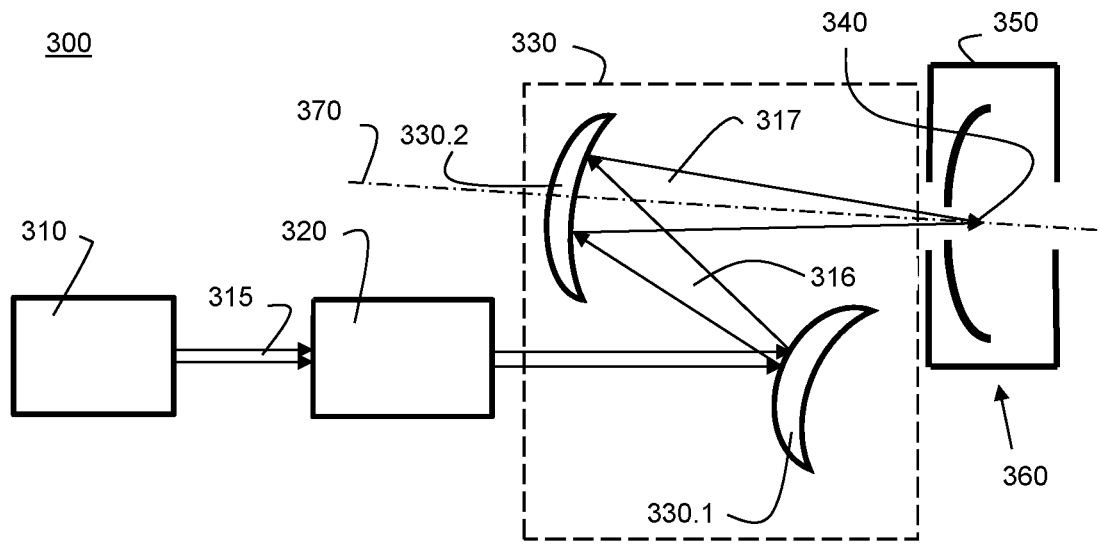
FIG. 3 depicts a laser system comprising a laser focusing system according to the present invention.

FIG. 3 schematically shows a laser system 300, the laser system 300 comprising a laser or laser source 310 configured to generate a laser beam 315. Such a laser or laser source 310 may e.g. comprise a seed laser and one or more power amplifiers for generating the laser beam 315. The laser system 300 further comprises a beam delivery system 320 that is configured to guide or direct the laser beam 315 towards the desired location. In the embodiment as shown, the laser system 300 further comprises a laser focusing system 330 according to an embodiment of the present invention. Note that the laser focusing system 330 may also serve to guide or direct a laser beam towards a desired location, as will be explained in more detail below.

In the embodiment as shown, the laser focusing system 330 comprises a first curved mirror 330.1 that is configured to receive the laser beam 315 from the beam delivery system 320 and generate a first reflected laser beam 316. The laser focusing system 330 further comprises a second curved mirror 330.2 configured to receive the first reflected laser beam 316 and generate a second reflected laser beam 317. In the embodiment as shown, the laser focusing system 330 is configured to focus the second reflected laser beam 317 onto a target location 340. FIG. 3 schematically shows the target location 340 as being arranged inside a vessel or enclosure 350 of an EUV radiation source or source collector module 360. Such an enclosure 350 may thus be compared to an enclosure 220 of the source collector module SO as shown in FIG. 2.

In contrast to the arrangement as shown in FIG. 2, the laser focusing system 330 according to the embodiment of the present invention is arranged in such manner that the second reflected laser beam 317 has an optical axis 370 that is substantially parallel to a horizontal plane. In an embodiment of the present invention, the laser focusing system is thus configured in such manner that the laser beam 317 which focusses on the droplet target in the EUV radiation source has an optical axis that is substantially horizontally, i.e. substantially parallel to the indicated Y-direction. Within the meaning of the present invention, substantially horizontally refers to an angle relative to the horizontal plane that is smaller than or equal to 25 degrees, preferably smaller than 20 degrees. The application of a laser focusing system such as system 330 enables to arrange the second reflected laser beam 317 to be substantially parallel to the laser beam 315 as received from a beam delivery system. Within the meaning of the present invention, two laser beams may be configured to be substantially parallel when a difference in orientation between the laser beams is less than 25 degrees, preferably less than 20 degrees. In case the laser beam 315 has a substantially horizontal orientation, the optical axis of the laser beam 317 that focusses on the droplet target is thus at an angle that is larger than 65 degrees relative to the vertical axis, i.e. the indicated Z-axis. As will be appreciated by the skilled person, the selection of the angle of the optical axis of the laser beam 317 that focuses on the target also affect the optical axis of the generated EUV light downstream. In particular, as is e.g. apparent from the arrangement shown in FIG. 2, the optical axis O of the generated EUV radiation beam will typically be in the same direction as the optical axis 224 of the laser beam that focusses on the target droplet. Typically, as illustrated in FIG. 3, the laser beam focusing on the droplet target, in general the fuel target, will irradiate the target via a central opening in a collector mirror, e.g. mirror 380 shown in FIG. 3 or mirror CO shown in FIG. 2, said mirror focusing the generated EUV radiation substantially along the same optical axis as the laser beam that focused on the fuel target. As such, the laser focusing system according to the present invention enables the generation of an EUV radiation beam along a substantially horizontal axis, whereas, in known EUV radiation source designs that are used in a lithographic apparatus, an optical axis O of the EUV radiation beam, e.g. the angle of the EUV radiation beam applied to the illumination system IL shown in FIG. 2, is at an comparatively large angle relative to the horizontal plane. It has been observed by the inventors that that application of a comparatively large angle adversely affect the design options for the illumination system IL and projection system PS downstream. It has been devised that the application of a comparatively small angle of the generated EUV radiation beam enables a design of the optical system downstream of the EUV radiation source with fewer components. As an alternative to the arrangement as shown in FIG. 3, whereby the second reflected laser beam 317 has an optical axis 370 that is substantially parallel to a horizontal plane, the laser focusing system may be configured such that an angle between the optical axis 370 of the second reflected laser beam 317 and a horizontal plane is between 50 degrees and 75 degrees.

Figure 4:
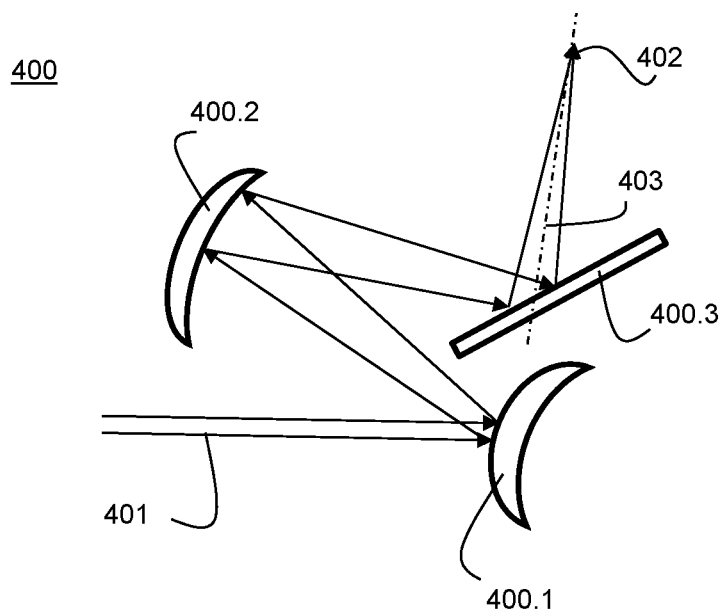
FIG. 4 depicts a laser focusing system as known in the art.

It can further be pointed out that the laser focusing system according to the invention also results in an improved optical design compared to typical or known designs of laser focusing systems as applied for use in EUV radiation sources. As can e.g. be seen from FIG. 3, the laser focusing system according to the present invention applies a curved mirror 330.2 as the last optical element that directs the laser beam 317 onto the fuel target or towards the target location 340. In a known laser focusing system, typically a flat mirror would be applied as the last optical element. An example of such a known arrangement is schematically shown in FIG. 4. The laser focusing system 400 as schematically shown in FIG. 4 comprises a curved mirror 400.1 that is configured to receive a laser beam 401 and reflect the laser beam 401 towards a second curved mirror 400.2 which reflects the laser beam towards a flat third mirror 400.3, the third flat mirror 400.3 focusing the laser beam towards a focal point 402 along a substantially vertical optical axis 403. It has been observed by the inventors that the known design may suffer from one or more of the following drawbacks: The flat third mirror 400.3 may result in a substantial contribution in the system's aberrations, such as astigmatism, due to a deformation of said mirror. Since the angle of incidence on the flat third mirror depends on location of incidence, it may also cause a retardation. Further, because the flat third mirror is comparatively close to the focal point 402, and thus the plasma generation location, and its orientation is nearly horizontal, it may be more susceptible to contamination or degradation, e.g. coating or optical surface quality degradation.

In accordance with the present invention, a laser focusing system is provided in which these drawbacks are removed or mitigated. In an embodiment of the present invention, the last mirror 330.2 that focusses the laser beam 317 onto the target or target location is thus a curved mirror rather than a flat mirror. Examples of such mirrors that may be applied in the present invention include spherical mirrors, paraboloid or parabolic mirrors, elliptical mirrors, axisymmetric mirrors or freeform mirrors. In accordance with the present invention, the penultimate mirror 330.1 along the optical path of the laser beam focusing on the target location is also a curved mirror. In an embodiment, said mirror is configured to diverge the received laser beam, e.g. the laser beam received from the laser source or the beam delivery system. By applying, as the penultimate mirror, a diverging mirror, diverging the received laser beam, the laser beam 317 focusing on the target location may be configured to have a comparatively large numerical aperture (NA) while at the same time being comparatively remote from the target location 340. Or, phrased differently, in case mirror 330.1 would not be a diverging mirror but rather a flat mirror, the cross-section of the beam 316 impacting the second mirror 330.2 would be smaller and, in order to arrive at a focusing laser beam 317 having a comparatively large NA, the mirror 330.2 would have to be comparatively close to the target location 340. Having the second mirror 330.2 at a comparatively large distance from the target location 340 provides the advantage of mitigating the risk of contamination of said mirror, said contamination e.g. being caused by the focusing laser beam 317 impacting the fuel target. As such, the sequence of having a diverging penultimate mirror 330.1 followed by a converging mirror 330.2 that reflects the focusing laser beam towards a target location, can be considered to provide substantial advantages over the prior art laser focusing system. By providing the focusing laser beam towards the target location along a substantially horizontal optical axis, further advantages may be obtained.

In an embodiment of the present invention, the first and/or second curved mirror of the laser focusing system are configured to receive the laser beam at a comparatively small angle of incidence. In an embodiment, the angle of incidence of the laser beam onto either the first curved mirror, the second curved mirror or both is smaller than or equal to 30 degrees, preferably smaller than or equal to 25 degrees. By doing so, a more accurate wave front of the laser beam impinging the droplet target or fuel target can be realized. In order to realize this, the vertical positions of the mirrors should be comparatively close to each other. Phrased differently, when the vertical position of the curved mirrors 330.1 and 330.2 is substantially different, it may be difficult to realize the desired low incidence angles. Typically, a vertical position of the laser beam 315 as received from the laser source or beam delivery system is lower than a desired vertical position of the focusing laser beam 317 that is focused on the target position 340. Further, for practical reasons, it may be cumbersome or undesirable to elevate the laser source or laser beam delivery system to the desired level in order for the laser beam to arrive at a desired vertical position such that a comparatively small angle of incidence of the curved mirrors of the laser focusing system is realized. In order to avoid this, an embodiment of the present invention further includes one or more additional mirrors that are configured to redirect the laser beam, e.g. laser beam 315 as received from the beam delivery system, towards the first curved mirror. As the one or more additional mirrors are configured to redirect or reposition the laser beam such that it arrive at a suitable location and orientation relative to first curved mirror, the one or more additional mirrors may also be considered part of a beam delivery system In an embodiment of the present invention, the amount of additional mirrors configured to redirect the laser beam towards the first curved mirror is smaller than 5.

In an embodiment of the present invention, the one or more additional mirrors may comprise or form a periscope or telescope system. Such a system may e.g. be configured to translate the laser beam 315 as provided by the laser source or the beam delivery system in the vertical direction. Such a periscope system as applied in an embodiment of the present invention thus enables to translate the laser beam 315 as received by the laser focusing system in the vertical direction.

Figure 5:
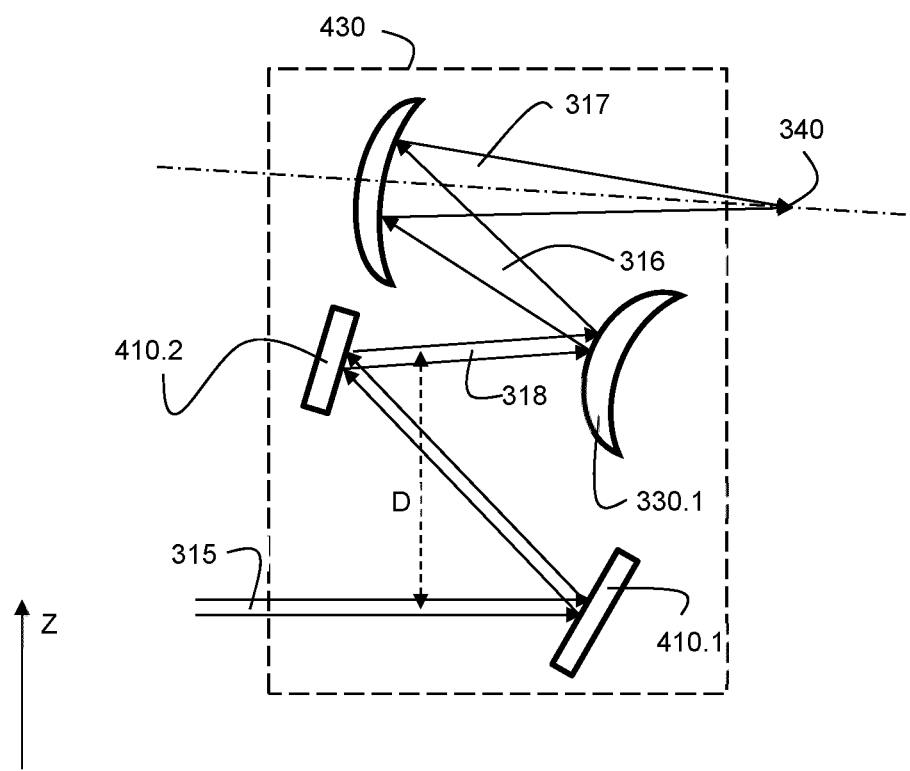
FIG. 5 depicts a laser focusing system according to an embodiment of the present invention.

FIG. 5 schematically shows a laser focusing system 430 according to an embodiment of the present invention, the laser focusing system comprising a periscope system comprising a pair of mirrors 410.1, 410.2 that are configured to reflect the incoming laser beam 315, e.g. received from a laser source or a laser beam delivery system, in such manner that the laser beam 318 that is reflected off the second mirror 410.2 of the periscope system, propagates along a substantially horizontal direction at an elevated vertical position. In the embodiment as shown, the incoming laser beam 315 is e.g. elevated in vertical direction over a distance D. By elevating the laser beam 315 as received from the laser source or beam delivery system, the angle of incidence of the laser beam at the curved mirrors 330.1 and 330.2 can be kept comparatively small. This can be appreciated when considering that without the flat mirrors 410.1 and 410.2, mirror 330.1 would have to be at the location of mirror 410.1 to receive the laser beam 315.

In the embodiment as shown, the periscope system 410.1, 410.2 comprises two flat mirrors 410.1, 410.2. Alternatively, one or more mirrors of the periscope system 410.1, 410.2 may be curved mirrors as well. By applying one or more curved mirrors in the periscope system, a characteristic of the incoming laser beam 315 may be adjusted. In particular, the dimensions of the incoming laser beam 315 may be controlled using one or more curved mirrors in the periscope system. Further, by using one or more curved mirrors in the periscope system, the outgoing laser beam 318 of the periscope system may become a diverging or converging laser beam.

As will be understood by the skilled person, the periscope system as applied in the present invention may include more than two mirrors as well, e.g. three or four.

In an embodiment of the present invention, the laser focusing further comprising a control unit configured to control a position the target location 340, i.e. the location of the focal point of the second reflected laser beam 317 inside the EUV vessel 360 as illustrated in FIG. 3. Such control of the location of the focal point of the laser beam 317 facilitates to ensure that the laser beam 317 hits the fuel target, e.g. a tin droplet.

Figure 6:
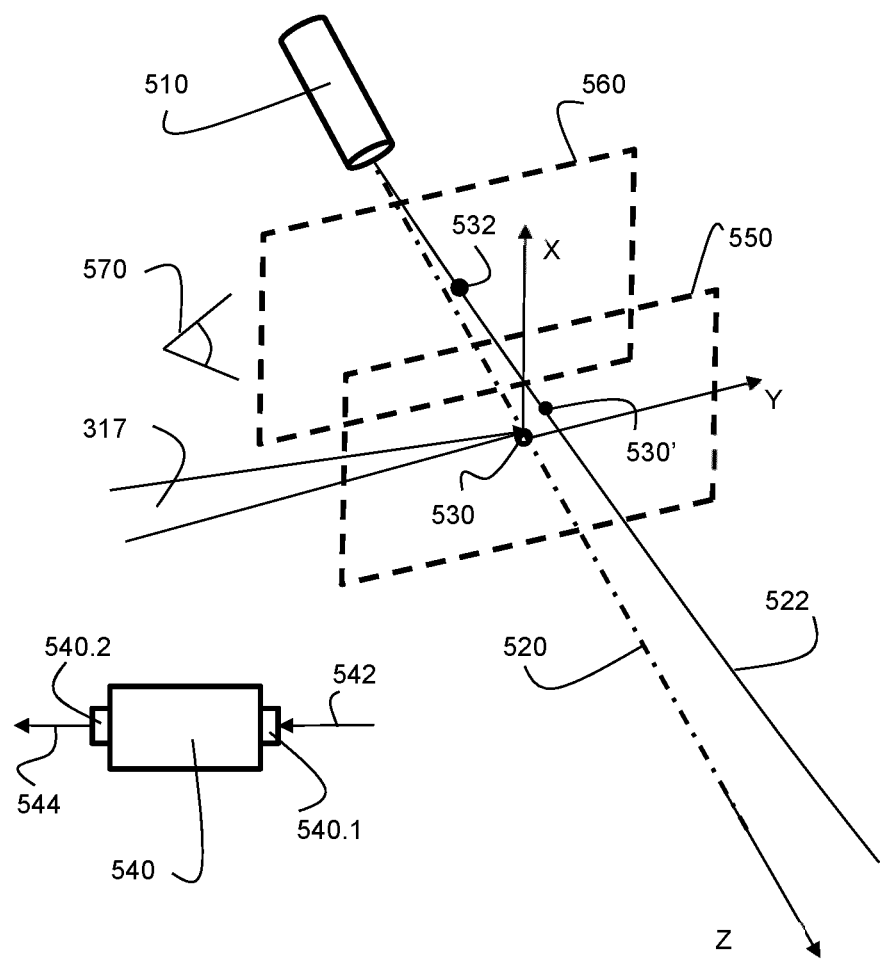
FIG. 6 depicts a fuel target as applied in an LPP radiation source and a laser beam configured to impinge on the fuel target.

FIG. 6 schematically shows a trajectory of a fuel target as may occur in an EUV vessel. FIG. 6 schematically shows a fuel target source 510, also referred to as a droplet generator 226 above, which is configured to generate a stream of fuel targets, e.g. tin droplets. The stream of fuel targets as generated is configured to propagate along the axis 520. Said axis 520 may e.g. cross a focal point 530 of a collector mirror such as mirror CO shown in FIG. 2 or a mirror 380 shown in FIG. 3. The axis 520 is considered to define a z-direction of a co-ordinate system as applied in the EUV vessel. In FIG. 6, dotted line 550 represents an xy-plane inside the EUV vessel, the xy-plane 550 comprising the focal point 530. The focal point 530 as shown may be considered to correspond to the target location 340 as shown in FIG. 5, i.e. the location at which the laser beam 317 should be focused, in order to realize an effective conversion of the fuel target to EUV light. In the embodiment as shown, the focal point 530 may e.g. be located in the origin of the defined xyz co-ordinate system. Due to imperfections in the fuel target source 510 and/or the applied fuel, the actual trajectory 522 of a fuel target may deviate somewhat from the ideal or desired trajectory 520. As a result, the laser beam 317 as provided by the laser focusing system may have to focus at a slightly different location 530', in order to effectively convert the fuel target to EUV light. In order to anticipate on a possible deviating trajectory of the fuel target, it is desirable to control a position of the target location, i.e. the position at which the laser beam outputted by the laser focusing system is focused.

In order to control a position of the target location, an embodiment of the laser focusing system according to the present invention further comprises a control system 540. The control unit 540 may e.g. be embodied as a controller, microcontroller, computer or the like. The control unit 540 may comprise one or more input terminals 540.1 for receiving one or more input signals 542 and one or more output terminals 540.2 for outputting one or more output signals 544 for controlling the laser focusing system.

In an embodiment of the present invention, the control unit 540 as applied may be configured to receive, as an input signal 542, a target location signal representative of a location of the fuel target that is to be hit by the laser beam 317 of the laser focusing system. Such a target location signal may e.g. be generated by a detector configured to detect a location of a target such as a fuel target. In FIG. 6, such a detector 570 is schematically shown. In the embodiment as shown, the detector 570 is configured to detect a target 532, e.g. a liquid fuel target, when said target 532 crosses a plane 560. In an embodiment, the detector may comprise multiple detectors or one or more detector arrays configured to determine an x,y location of a target 532 when it crosses the plane 560. The detector 570 may further be configured to output a target location signal representing said x,y location of the target. In the embodiment as shown, the plane 560 is substantially parallel to the plane 550 and is arranged in between the fuel target source 510 and the plane 550 comprising the focal point 530 of the collector mirror. As such, the detector 570 will detect the fuel target 532 prior to the fuel target crossing the plane 550. During the time the target travels from location 532 to location 530', the control unit 540 may derive, based on the target location signal as received, the co-ordinates of the location 530', i.e. the location where the fuel target will cross the plane 550. Based on said determined co-ordinates of the location of the fuel target, the control unit 540 may then determine one or more output signals 544, also referred to as control signals, for controlling the laser focusing system in such manner that the focal point of the laser beam 317 will substantially coincide with the location 530' of the fuel target.

In an embodiment, the one or more output signals 544 may e.g. be applied to control a position, orientation and/or shape of one or more optical elements of the laser focusing system, thereby controlling a position of the focal point of the laser beam outputted by the laser focusing system, e.g. laser beam 317. In such embodiment, the one or more output signals may e.g. be applied to control a position, orientation and/or shape of one or more mirrors as applied in the laser focusing system according to the invention. By controlling the position, orientation and/or shape of one or more mirrors as applied in the laser focusing system, the position of the focal point of the second reflected laser beam 317 can be controlled in one or more degrees of freedom.

In an embodiment, the one or more optical elements of the laser focusing system may be mounted to one or more frames. In such embodiment, a position, orientation and/or shape of one or more mirrors as applied may be controlled by controlling a position of the one or more frames. In an embodiment with at least two optical elements of the laser focusing system, the at least two optical elements can be mounted to a common frame so that their position, orientation and/or shape can be controlled synchronously and/or simultaneously.

In accordance with the present invention, various control strategies may be implemented to ensure that the second reflected laser beam 317 as outputted by the laser focusing system focusses on the target location when the fuel target arrives at said location.

Said strategies may include controlling a position of the focal point inside the EUV vessel in one or more degrees of freedom, by controlling the position, orientation or shape of at least one of the first periscope mirror, the second periscope mirror, the first curved mirror or the second curved mirror or any combination thereof. The control strategies as applied may further include controlling a timing of the laser beam or laser pulse, thereby controlling at which location along a trajectory of a fuel target the fuel target is irradiated.

Figure 7:
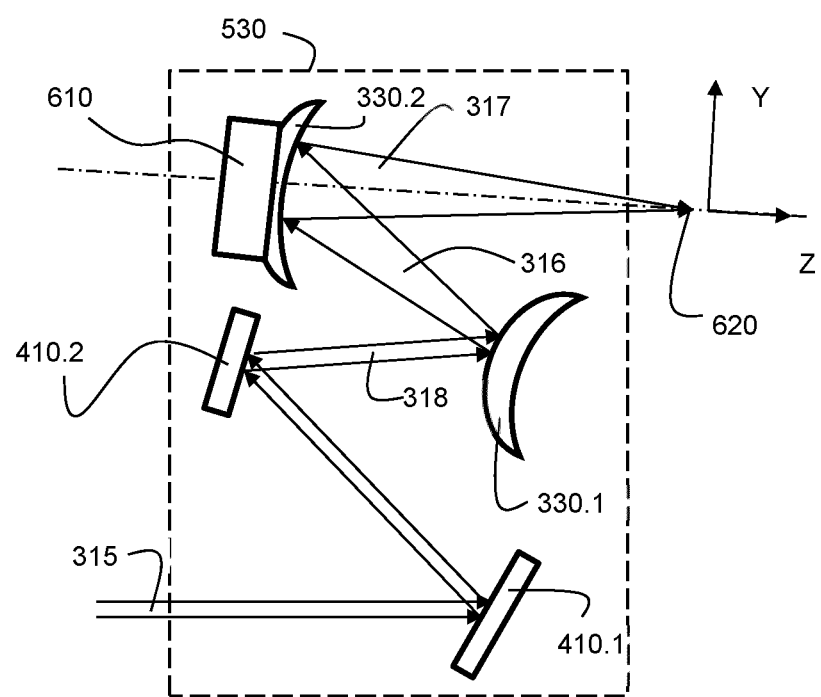
FIG. 7 depicts a laser focusing system according to the present invention in which a first control strategy is implemented.

As a first example, the control unit is configured to control a position of the focal point inside the EUV vessel in three degrees of freedom, by controlling the position, orientation or shape of one of the first periscope mirror, the second periscope mirror, the first curved mirror or the second curved mirror or any combination thereof. Such an example is schematically illustrated in FIG. 7. FIG. 7 schematically shows a laser focusing system 530 according to an embodiment of the present invention, the laser focusing system 530 comprises a first periscope mirror 410.1, a second periscope mirror 410.2, a first curved mirror 330.1 and a second curved mirror 330.2. The laser focusing system 530 may advantageously be applied to focus a laser beam 317 to a focal point 620, said focal point e.g. corresponding to a focal point of a collector mirror of an EUV radiation source. In the example as shown, the Z-axis is assumed to coincide with the optical axis of the second reflected laser beam 317 as outputted by the laser focusing system 530, the Y-axis is as indicated in the drawing, the X-axis is assumed perpendicular to the YZ-plane. Compared to co-ordinate system of FIG. 6, the X-axis as shown in FIG. 7 could e.g. coincide or be parallel to the Z-axis shown in FIG. 6. In the embodiment as shown, the second curved mirror 330.2 is configured to be displaceable along the Z-axis, the Y-axis and the X-axis. Such displacements can e.g. be realised by an actuator assembly 610. Such an actuator assembly may e.g. comprises one or more actuators for displacing the mirror 330.2 along the indicated axis. As will be appreciated by the skilled person, a displacement of the mirror 330.2 in either the Z-direction, the Y-direction or the X-direction, will result in a displacement of the focal point 620 of the second reflected laser beam 317 as well. As such, by controlling the position of the second curved mirror 330.2 in three degrees of freedom, the focal point 620 can be adjusted in accordance with an expected target location, i.e. a location where the fuel target is expected to be when the laser pulse is supplied. When using such embodiment, the control unit of the laser focusing system may e.g. be configured to determine where a fuel target will be at a certain instant, e.g. an instant when the laser is fired. In such embodiment, the control unit, e.g. control unit 540 may thus determine, based on the target location signal as received, the trajectory of the fuel target and use this trajectory to control the laser focusing system to focus the laser beam 317 onto the location where the target will be when the laser is fired. In such embodiment, the timing or firing of the laser is thus assumed fixed. Based on a known instant when the laser will be fired and a known trajectory of the target, the control unit determines where the target will be at the known firing instant. In an alternative embodiment, the firing of the laser, in particular the timing of the firing of the laser, can be considered a variable. In such an embodiment, it may be sufficient to control the focal point position in only two degrees of freedom. With reference to FIG. 6, it can be pointed out that the control unit 540 may be configured to determine when a particular target, which has been detected when passing the plane 560, will reach or cross the plane 550. Based on this, the control unit may be configured to control the time of firing the laser beam 317 such that the laser is fired when the fuel target reaches or crosses the plane 550. In such embodiment, there is thus no need to control a position of the focal point along the Z-axis shown in FIG. 6 by controlling an orientation or position of the laser beam along said Z-axis. As such, in an embodiment of the present invention, the control unit of the laser focusing system is configured to control the position of the laser focal point in two degrees of freedom combined with a controlled timing of the laser beam. In such embodiment, the actuator assembly 610 as schematically shown in FIG. 7 may be configured to control a position of the focal point of the laser beam 317 in the YZ-plane as indicated, combined with a control of the timing of the laser beam, so as to ensure that the fuel target is irradiated by the laser beam 317 at the desired location, e.g. as close as possible to focal point of a collector mirror of an EUV radiation source in which the laser focusing system is used.

In the embodiment as shown in FIG. 7, the actuator assembly 610 is configured to control the position of the second curved mirror 330.2 in three or two degrees of freedom, in order to control a position of the focal point 620 of the laser beam 317. Similar effects may be obtained by controlling a position of one or more of the other mirrors as applied in the laser focusing system according to the invention.

Figure 8:
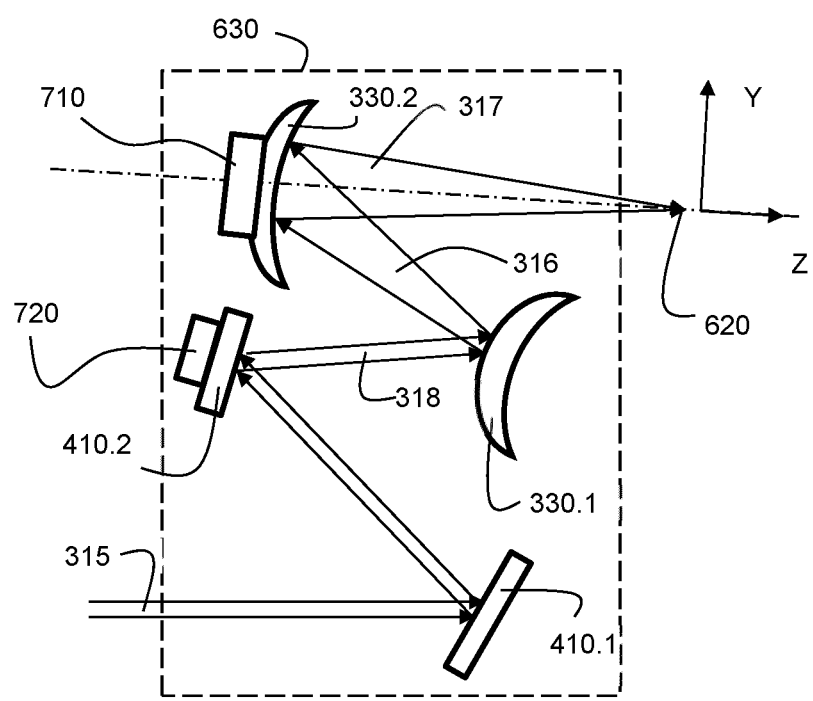
FIG. 8 depicts a laser focusing system according to the present invention in which a second control strategy is implemented.

In a second example of a control strategy as can be applied in a laser focusing system according to the present invention, the required focal point control is distributed over multiple mirrors. Such an embodiment is schematically illustrated in FIG. 8. FIG. 8 schematically shows a laser focusing system 630 according to an embodiment of the present invention, the laser focusing system 630 comprises a first periscope mirror 410.1, a second periscope mirror 410.2, a first curved mirror 330.1 and a second curved mirror 330.2. A similar co-ordinate system XYZ as shown in FIG. 7 is assumed. In the embodiment as shown, the laser focusing system 630 further comprises a first actuator assembly 610 that is configured to position or displace the second curved mirror 330.2 in the Z-direction, i.e. in the direction of the optical axis of the second reflected laser beam 317. The laser focusing system 630 further comprises a second actuator assembly 720 that is configured to rotate or tilt the second periscope mirror 410.2 about the Y-axis and about the X-axis. By means of the first actuator assembly 710 and the second actuator assembly 720, the laser beam that propagates through the laser focusing system is thus controlled in three degrees of freedom. By doing so, a focal point 620 of the second reflected laser beam 317 is thus controlled in three degrees of freedom X, Y, Z by controlling the position of the second curved mirror 330.2 in the Z-direction and tilting the second periscope mirror 410.2 about the X-axis and about the Y-axis. Z, Rx and Ry (Rx and Ry referring to rotation or tilt about the X-resp. Y-axis). By doing so, a focal point 620 of the second reflected laser beam 317 may be controlled in three degrees of freedom as well. Such a laser focusing system 630 may thus advantageously be applied to control a position of the laser focal point 620 inside an EUV radiation source.

In a similar manner as discussed above, the control strategy as illustrated by the second example may also be combined with a control of the timing of the firing of the laser beam. By doing so, a control of the position or orientation in only two degrees of freedom may be sufficient to obtain an effective control of the laser focal point, i.e. a control whereby the second reflected laser beam 317 is configured to focus on the target location of a fuel target.

Figure 9:
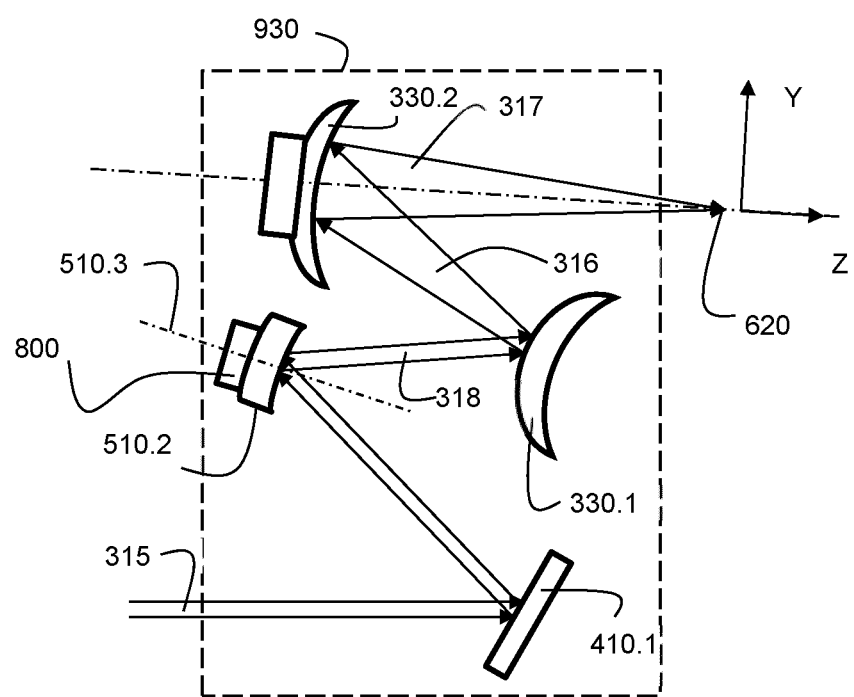
FIG. 9 depicts a laser focusing system according to the present invention in which a third control strategy is implemented.

FIG. 9 schematically illustrates a third example of a control strategy as can be applied in an embodiment of a laser focusing system according to the invention. FIG. 9 schematically shows a laser focusing system 930 according to an embodiment of the present invention, the laser focusing system 930 comprises a first periscope mirror 410.1, a second periscope mirror 510.2, a first curved mirror 330.1 and a second curved mirror 330.2. In the embodiment as shown, the second periscope mirror 510.2 is a curved mirror, rather than a flat mirror. The second periscope mirror 510.2 may either be a concave mirror or a convex mirror. In the embodiment as shown, the laser focusing system 930 further comprises an actuator assembly 800 that is configured to control a position and orientation of the second periscope mirror 510.2. in particular, the actuator assembly 800 is configured to position or displace the second periscope mirror 510.2 along the optical axis 510.3 of the mirror 510.2. By doing so, a position of the focal point 620 of the laser beam 317 along the Z-axis can be modified or adjusted. The actuator assembly 800 may further be configured to rotate or tilt the second periscope mirror 510.2 about the Y-axis and about the X-axis, e.g. in a similar manner as the actuator assembly 720 of the second example. By doing so, a control of the position of the focal point 620 of the laser beam 317 in three degrees of freedom is again obtained. In a similar manner as discussed above, the control strategy as illustrated by the third example may also be combined with a control of the timing of the firing of the laser beam. By doing so, a control of the position or orientation in only two degrees of freedom may be sufficient to obtain an effective control of the laser focal point, i.e. a control whereby the second reflected laser beam 317 is configured to focus on the target location of a fuel target.

As a fourth example how to control a focal point position using a laser focusing system according to the present invention, the use of one or more deformable mirrors can be mentioned. By using a deformable mirror, a position of the focal point 620 of the second reflected laser beam 317 may be controlled as well. As an example, by adjusting a curvature of such a deformable mirror, the focal point position 620 can be displaced along the optical axis of the laser beam 317.

In an embodiment, the various control strategies as described above may advantageously be combined.

In an embodiment of the present invention, a control of the position of the focal point of the second reflected laser beam 317 in a particular degree of freedom or direction is established by a combined control of two or more optical components, e.g. mirrors, of the laser focusing system. As will be appreciated by the skilled person, the various different optical components, e.g. mirrors, as applied in a laser focusing system may have different characteristics such as different weights, different resonance frequencies, etc. As a result, the control performances or capabilities with respect to obtainable accuracy or resolution may be different for the different mirrors or optical components applied. In addition, the available or obtainable range may be different for the different optical components, range referring in this respect to the available or possible displacement range of the focal point in a certain degree of freedom.

In view of these characteristics, it may be sub-optimal to control the position of the focal point in a particular degree of freedom using only one component. It may e.g. be advantageous to control the position of the focal point in a particular degree of freedom by a combined control of said degree of freedom using two optical components or more.

Referring to the examples as described above, it can be pointed out that a positioning of the focal point of the laser beam 317 in the Z-direction as indicated in FIGS. 7-9 can be established by a translation of the second curved mirror 330.2, or by a translation of the second periscope mirror 410.2 or a displacement or deformation of a curved periscope mirror 510.2. rather than only using one of said options to displace the focal point of the laser beam 317 in the Z-direction, it may e.g. be advantageous to realize a required displacement of the focal point (e.g. based on a target location signal) by a combined displacement or deformation of at least two components. By doing so, the requirements with respect to controlling the position of the focal point in the particular degree of freedom can be obtained by a combined effort of the at least two components.

As an example, a control of the position of the focal point of the laser beam 317 in the Z-direction may e.g. be obtained by controlling a displacement of a first mirror of the laser focusing system and controlling a displacement of a second mirror of the laser focusing system. In such embodiment, the displacement of the first mirror may e.g. enable a displacement of the focal point position in the Z-direction over a comparatively large range, whereas the displacement of the second mirror may e.g. enable a displacement of the focal point position in the Z-direction over a comparatively small range, but with a higher accuracy. In such embodiment, the displacement of the first mirror may thus result in a coarse positioning of the focal point in the Z-direction, over a comparatively large range, whereas the displacement of the second mirror may thus result in a fine positioning of the focal point in the Z-direction, over a comparatively small range. Using such a combined effort of two or more optical components, an improved performance may be realized and/or control requirements of the one or more optical components may be relaxed.

In such an embodiment according to the present invention, i.e. an embodiment whereby the position of the focal point is controlled in a particular degree of freedom by a combined effort of at least two components, the control unit of the laser focusing system may be configured to determine, based on the target location signal as received, a first control signal for controlling a first optical component of the at least two components and a second control signal for controlling a second optical component of the at least two components. In such embodiment, the first control signal may be configured to displace, rotate or deform the first optical component so as to realize a first displacement of the focal point in the particular degree of freedom, whereas the second control signal may be configured to displace, rotate or deform the second optical component so as to realize a second displacement of the focal point in the particular degree of freedom; the combination of the first and second displacement resulting in the focal point being displaced to the required position.

In order to realize such a combined control effort, whereby two or more optical components such as mirrors are applied to realize a combined goal, e g realizing a particular focal point position in a particular degree of freedom, various control strategies can be applied.

In an embodiment, the control unit is configured to control the position of the focal point in one degree of freedom, by controlling a single mirror in one or multiple degrees of freedom. Alternatively, the control unit may be configured to control the position of the focal point in one degree of freedom, by controlling multiple mirrors in one or multiple degrees of freedom. In general, the control unit as applied in an embodiment of the laser focusing system according to the present invention may be configured to control the position of the focal point in N degrees of freedom, by controlling one or more mirrors in M degrees of freedom, whereby M=N, M and N being non-zero integer numbers. Alternatively, the control unit may be configured to control the focal point in N degrees of freedom, by controlling one or more mirrors in M degrees of freedom, whereby M≠N.

In an embodiment of the present invention, the set of mirrors as applied, i.e. the first curved mirror, the second curved mirror and optionally the one or more additional mirrors, comprises at least one long range mirror and at least one short range mirror. Within the meaning of the present invention, a long range mirror refers to a mirror that can be displaced over a comparatively large range whereas a short range mirror refers to a mirror that can be displaced over a comparatively short range. As such, in an embodiment of the present invention, the control unit of the laser focusing system may be configured to control a position and/or orientation of the at least one long range mirror over a comparatively large range and control a position and/or orientation of the at least one short range mirror over a comparatively short range.

In such embodiment, the control unit of the laser focusing system may e.g. comprises a low-bandwidth controller for controlling the at least one long range mirror and a high-bandwidth controller for controlling the at least one short range mirror. The low-bandwidth controller may e.g. be configured to apply a set and forget control of the long range mirror. In such embodiment, the low-bandwidth control may be used to desaturate the high bandwidth control.

In an embodiment, the at least one long range mirror may be controlled at a bandwidth <5 Hz. In an embodiment, the at least one short range mirror may be controlled at a bandwidth >0.1 Hz.

In order to displace or deform the one or more mirrors of the laser focusing system according to the present invention, various types of actuators may be applied. Examples of such actuators include, but are not limited to, electromagnetic actuators such as Lorentz actuators or piezo-electric actuators. In general, any linear or rotational actuator may be suited or adapted to be applied to control a position, orientation or shape of a mirror as applied in the laser focusing system according to the present invention.

FIGS. 5 to 9 illustrate various aspects and embodiments of laser focusing systems according to the present invention. As mentioned, the laser focusing system employs curved mirrors as ultimate and penultimate mirrors to bring the laser beam towards the focal point or target location 340, 530, 620. Various embodiments of the laser focusing system according to the present invention include additional mirrors upstream of the ultimate and penultimate curved mirrors.

It can be pointed out that various options exists for the position and orientation in space of the different mirrors as applied. In this respect, it can be pointed out that, although the laser beams shown in FIGS. 5-9 are drawn in a single plane, this need not be the case in practice.

Figure 10:
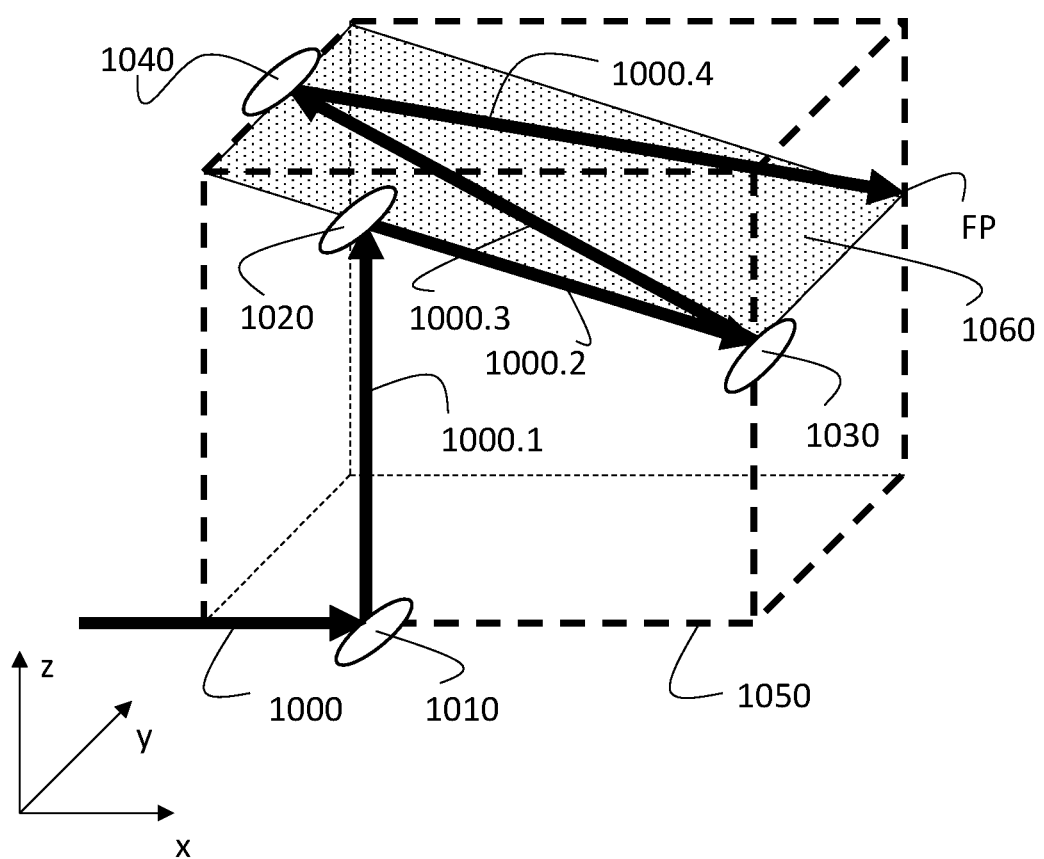
FIGS. 10 to 12 depict three possible embodiments of laser focusing systems according to the present invention.
Figure 11:
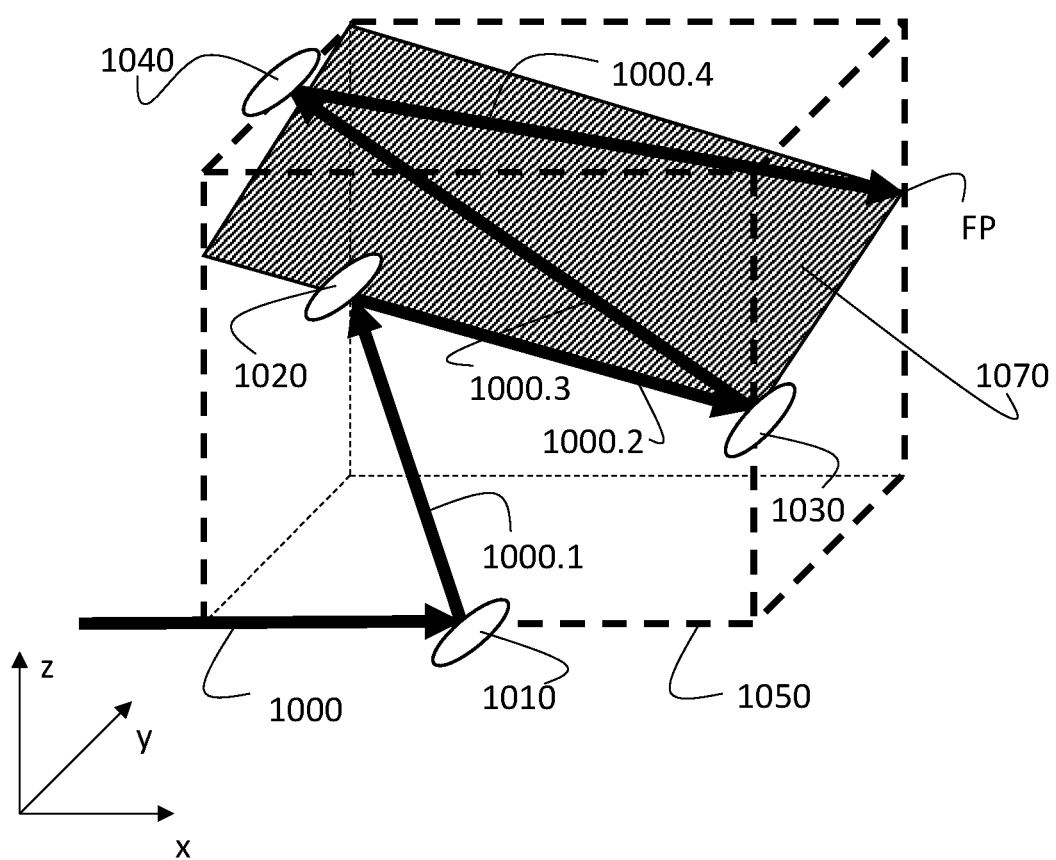
Figure 12:
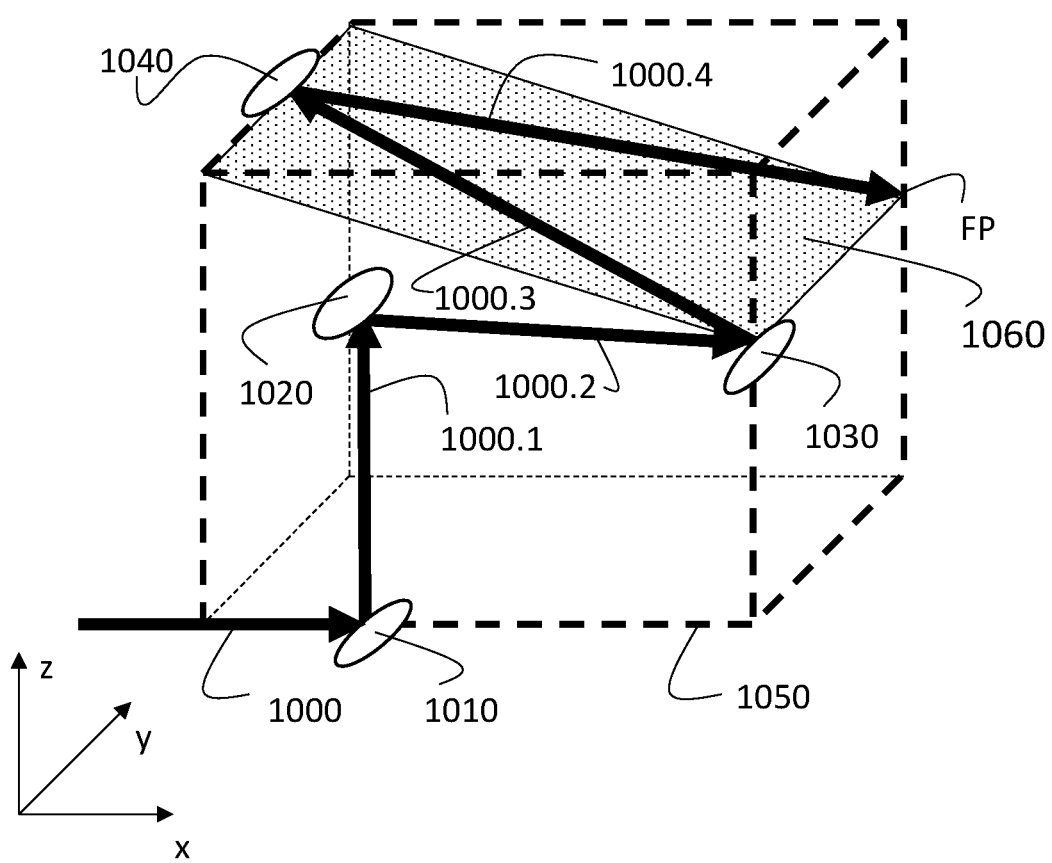

FIGS. 10 to 12 therefore schematically illustrate three possible embodiments of laser focusing systems according to the present invention in which not all laser beams are arranged in the same plane. Such arrangements may also be referred to as out-of-plane arrangements.

FIG. 10 schematically shows a path of a laser beam 1000 which is received by a first mirror 1010 and then proceeds along mirrors 1020, 1030, 1040 towards a focal point FP. In the embodiment as shown, mirrors 1040 and 1030 may e.g. correspond to the ultimate resp. penultimate mirrors 330.2 and 330.1 as described above.

In the embodiment as shown, mirrors 1010 and 1020 may e.g. correspond to mirrors or a periscope system such as the mirrors 410.1 and 410.2 as described above.

In the embodiment as schematically shown in FIG. 10, it can be observed that the laser beam 1000 as received by the first mirror 1010 and the laser beams 1000.1 and 1000.2, which are directed to mirrors 1020 and 1030 respectively, are arranged in a plane, i.e. a front plane of the cube 1050. In the embodiment as shown, the laser beams 1000.2, 1000.3 and 1000.4 are also arranged in a plane, indicated by reference number 1060. In the embodiment as shown, laser beams 1000, 1000.1 and 1000.2 are thus arranged in a first plane whereas laser beams 1000.2, 1000.3 and 1000.4 are arranged in a second, different, plane. It can be seen that, in the embodiment as shown, the first plane is perpendicular to the second plane. It can be pointed out that this need not be the case.

FIG. 11 schematically shows an embodiment of the laser focusing system according to the present invention, whereby the first plane, i.e. the front plane of cube 1050 comprising laser beams 1000, 1000.1 and 1000.2, is not perpendicular to a second plane 1070, the second plane comprising laser beams 1000.2, 1000.3 and 1000.4. Compared to the arrangement as schematically shown in FIG. 10, it can also be pointed out that laser beam 1000.1 is no longer perpendicular to laser beam 1000.

In the embodiments of FIGS. 10 and 11, the laser beams 1000.2, 1000.3 and 1000.4 are arranged in the same plane, either plane 1060 or plane 1070. It can be pointed out that alternative out-of-plane arrangements can be devised which do not require each plane to contain three of the laser beams 1000, 1000.1, 1000.2, 1000.3 and 1000.4.

FIG. 12 schematically shows an alternative embodiment of a laser focusing system according to the present invention, whereby laser beams 1000.2, 1000.3 and 1000.4 are not arranged in the same plane. In the embodiment as shown, laser beams 1000, 1000.1 and 1000.2 are arranged in the front plane of cube 1050 while laser beams 1000.3 and 1000.4 are arranged in the plane 1060. In contrast to the arrangement of FIG. 10, laser beam 1000.2 is not arranged in the same plane as laser beams 1000.3 and 1000.4.

It can be pointed out that, from an optical point of view, it may be preferred to have the laser beam that arrives at the penultimate mirror, the laser beam that arrives at the ultimate mirror and the laser beam emitted by the ultimate mirror to be in the same plane.

Although mirrors 1010 and 1020 as shown in FIGS. 10 to 12 are referred to as mirrors of a periscope system, it can be pointed out that the present invention may also be practiced without the use of a periscope system.

In this respect, it can be pointed out that a single mirror configured to receive a laser beam such as laser beam 1000 and configured to redirect the laser beam 1000 towards the penultimate curved mirror 1030 can be used to replace mirrors 1010 and 1020 as shown in FIGS. 10 to 12.

In general, the laser focusing system according to the present invention may thus comprise, in addition to the ultimate and penultimate curved mirrors, one or more additional mirrors for redirecting the laser beam towards the first curved mirror, i.e. the penultimate curved mirror. In such an arrangement, one can define a plane comprising the laser beam that is received by the most downstream mirror of said one or more additional mirrors and the laser beam that is reflected by said most downstream mirror towards the penultimate curved mirror. In FIGS. 10 to 12, mirror 1020 may serve as said most downstream mirror of the one or more additional mirrors.

With reference to the use of said one or more additional mirrors, an out-of-plane arrangement of the laser focusing system may also be defined as an arrangement whereby the laser beam as reflected by the most downstream mirror, e.g. mirror 1020, towards the penultimate curved mirror, e.g. mirror 1030, the reflected laser beam by the penultimate curved mirror and the laser beam reflected by the ultimate curved mirror, e.g. mirror 1040, are not arranged in the same plane. In such arrangement, the laser beam that is redirected towards the first curved mirror, the first reflected laser beam and the second reflected laser beam are thus arranged in substantially a different plane.

The laser focusing system according to the present invention may advantageously be applied in a laser source according to the present invention. Such a laser source may e.g. comprise a seed laser and one or more power amplifiers and an optional beam delivery system.

The laser source according to the present invention may advantageously be applied in an LPP radiation source, e.g. a radiation source for generating EUV radiation suitable for use in an EUV lithographic apparatus.

While specific embodiments of the invention have been described above, it will be appreciated that the invention may be practiced otherwise than as described. The behavior of the apparatus may be defined in large part by a computer program containing one or more sequences of machine-readable instructions for implementing certain steps of a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the clauses set out below.

1. A laser focusing system for use in an EUV radiation source, the laser focusing system comprising: a first curved mirror configured to receive a laser beam from a beam delivery system and generate a first reflected laser beam; a second curved mirror configured to receive the first reflected laser beam and generate a second reflected laser beam, wherein the laser focusing system is configured to focus the second reflected laser beam to a target location in a vessel of the EUV radiation source.
2. The laser focusing system according to clause 1, wherein an angle between the optical axis of the second reflected laser beam and a horizontal plane is smaller than 25 degrees, preferably smaller than 20 degrees.
3. The laser focusing system according to clause 1, wherein an angle between the optical axis of the second reflected laser beam and a horizontal plane is between 50 degrees and 75 degrees.
4. The laser focusing system according to clause 1, 2 or 3, wherein the first curved mirror is configured to receive the laser beam at an incidence angle that is smaller than 30 degrees.
5. The laser focusing system according to clause 1, 2 or 3, wherein the first curved mirror is configured to receive the laser beam at an incidence angle that is between 30 degrees and 45 degrees.
6. The laser focusing system according to any of the clauses 1 to 5, wherein the second curved mirror is configured to receive the laser beam at an incidence angle that is smaller than 30 degrees.
7. The laser focusing system according to any of the clauses 1 to 5, wherein the second curved mirror is configured to receive the laser beam at an incidence angle that is between 30 degrees and 45 degrees.
8. The laser focusing system according to any of the preceding clauses, wherein the first curved mirror comprises a parabolic, spherical, elliptical, axisymmetric or freeform reflective surface.
9. The laser focusing system according to any of the preceding clause, wherein the second curved mirror comprises an elliptical, parabolic, spherical, axisymmetric or freeform reflective surface.
10. The laser focusing system according to any of the preceding clauses, further comprising one or more additional mirrors, configured to redirect the laser beam towards the first curved mirror.
11. The laser focusing system according to clause 10, wherein the amount of additional mirrors configured to redirect the laser beam towards the first curved mirror is smaller than 5.
12. The laser focusing system according to clause 10, wherein one or more of the additional mirrors is configured to overcome a difference in orientation between the incident and by the first curved mirror requested laser beam.
13. The laser focusing system according to clause 10, wherein the one or more additional mirrors comprises a periscope system.
14. The laser focusing system according to clause 13, wherein the periscope system is configured to overcome a difference in location between the received laser beam and the redirected laser beam.
15. The laser focusing system according to clause 13 or 14, wherein the periscope system is configured to translate the laser beam in a substantial vertical direction.
16. The laser focusing system according to any of the clauses 13-15, wherein the periscope system comprises a first periscope mirror for receiving the laser beam and reflecting the laser beam towards a second periscope mirror, the second periscope mirror being configured to reflect the laser beam towards the first curved mirror.
17. The laser focusing system according to any of the clauses 10 to 16, wherein one or more mirrors of the additional mirrors is curved.
18. The laser focusing system according to clause 17, wherein the one or more curved additional mirrors comprise a ellipsoid, paraboloid, spherical, axisymmetric or freeform reflective surface.
19. The laser focusing system according to clause 17 or 18, wherein the one or more curved additional mirrors form a telescope system configured to change a diameter of the laser beam.
20. The laser focusing system according to clause 18 or 19, wherein the one or more curved additional mirrors form a telescope system configured to change a divergence of the laser beam.
21. The laser focusing system according to any of the clauses 10 to 20, wherein the laser beam that is redirected towards the first curved mirror, the first reflected laser beam and the second reflected laser beam are arranged in substantially the same plane.
22. The laser focusing system according to any of the clauses 10 to 20, wherein the laser beam that is redirected towards the first curved mirror, the first reflected laser beam and the second reflected laser beam are arranged in substantially a different plane.

23. The laser focusing system according to any of the clauses 10 to 20, wherein the laser beam received by the one or more additional mirrors and the laser beam that is redirected towards the first curved mirror define a first plane, and wherein the first reflected laser beam and the second reflected laser beam define a second plane, the second plane being different from the first plane.
24. The laser focusing system according to clause 23, wherein the first plane is substantially perpendicular to the second plane.
25. The laser focusing system according to clause 23, wherein the second plane is non-perpendicular to the first plane.
26. The laser focusing system according to clause 23 or 25, wherein the second plane is parallel to the first plane.
27. The laser focusing system according to clause 22, 23 or 24, wherein the laser beam that is redirected towards the first curved mirror is arranged in both the first plane and the second plane.
28. The laser focusing system according to clause 22, 23 or 24, wherein the laser beam that is redirected towards the first curved mirror is not arranged in the second plane.
29. The laser focusing system according to any of the preceding clauses, whereby the laser beam as received by the first curved mirror, the first reflected laser beam and the second reflected laser beam are not arranged in the same plane.
30. The laser focusing system according to any of the preceding clauses, further comprising a control unit configured to control a position of a focal point of the second reflected laser beam inside the EUV vessel.
31. The laser focusing system according to clause 30, wherein the control unit is configured to receive a target location signal representative of a location of a target for the second reflected laser beam, and wherein the control unit is configured to control the position of the focal point of the second reflected laser beam based on the target location signal.
32. The laser focusing system according to clause 31, wherein the target location signal comprises a target location trajectory representing a location of the target as a function of time.
33. The laser focusing system according to clause 31, wherein the control unit is configured to control a timing of the laser beam, based on the target location trajectory.
34. The laser focusing system according to clause 33, wherein the control unit is configured to control a position of the focal point inside the EUV vessel in a plane substantially perpendicular to the target location trajectory.
35. The laser focusing system according to clause 34, wherein the control unit is configured to control the timing of the laser beam so as to focus the laser beam onto the target when the target reaches or crosses the plane.
36. The laser focusing system according to clause 35, wherein the plane comprises a focal point of a collector mirror of the EUV radiation source.
37. The laser focusing system according to any of the clauses 30 to 36, wherein the control unit is configured to control a position of the focal point inside the EUV vessel in three degrees of freedom, by controlling the position, orientation or shape of at least one of the first curved mirror or the second curved mirror or one or more of the additional mirrors.
38. The laser focusing system according to clause 37, wherein the control unit is configured to control a position and/or orientation of the second curved mirror in one, two, or three degrees of freedom.
39. The laser focusing system according to clause 38, wherein the control unit is configured to control a position and/or orientation of the first curved mirror in one, two, or three degrees of freedom.
40. The laser focusing system according to clause 39, wherein the first curved mirror and the second curved mirror are mounted onto a frame.
41. The laser focusing system according to clause 40, wherein the control unit is configured to control a position and/or orientation of the frame in one, two, or three degrees of freedom.
42. The laser focusing system according to any of the clauses 38 to 41, wherein the first curved mirror, the second curved mirror and the one or more additional mirrors comprises at least one long range mirror and at least one short range mirror.
43. The laser focusing system according to clause 42, wherein the control unit is configured to control a position and/or orientation of the at least one long range mirror over a comparatively large range and control a position and/or orientation of the at least one short range mirror over a comparatively short range.
44. The laser focusing system according to clause 43, wherein the at least one long range mirror comprises set and forget functionality.
45. The laser focusing system according to clause 44, wherein the at least one long range mirror comprises a bandwidth <5 Hz.
46. The laser focusing system according to clause 43 wherein the at least one short range mirror comprises a bandwidth >0.1 Hz.
47. The laser focusing system according to any of the preceding clauses referring to clause 31, wherein the control unit is configured to control the position of the focal point in one degree of freedom, by controlling a single mirror in one or multiple degrees of freedom.
48. The laser focusing system according to any of the preceding clauses referring to clause 31, wherein the control unit is configured to control the position of the focal point in one degree of freedom, by controlling multiple mirrors in one or multiple degrees of freedom.
49. The laser focusing system according to any of the preceding clauses referring to clause 31, wherein the control unit is configured to control the position of the focal point in N degrees of freedom, by controlling one or more mirrors in M degrees of freedom, whereby M=N.
50. The laser focusing system according to any of the preceding clauses referring to clause 31, wherein the control unit is configured to control the focal point in N degrees of freedom, by controlling one or more mirrors in M degrees of freedom, whereby M N.
51. The laser focusing system according to any of the clauses 31 to 50, further comprising a detector configured to detect the location of the target, the detector being configured to output the target location signal.
52. The laser focusing system according to any of the clauses 31 to 51, wherein the control unit is configured to control a position of the focal point inside the EUV vessel in a plane substantially perpendicular to a trajectory of the target in two degrees of freedom.

53. The laser focusing system according to any of the preceding clauses, wherein the laser beam has an optical axis that is substantially parallel to the horizontal plane.
54. The laser focusing system according to clause 16, wherein the first periscope mirror and/or the second periscope mirror are substantially flat mirrors.
55. The laser focusing system according to clause 16, wherein the first periscope mirror and/or the second periscope mirror comprise a curved mirror.
56. The laser focusing system according to clause 16, wherein the first periscope mirror and/or the second periscope mirror are substantially flat mirrors.
57. Laser source comprising a laser focusing system according to any of the preceding clauses.
58. EUV radiation source comprising a laser source according to clause 57.
59. Lithographic apparatus comprising an EUV radiation source according to clause 58.

The invention claimed is:

1. A laser focusing system comprising:
a first curved mirror configured to receive a laser beam from a beam delivery system and generate a first reflected laser beam; and
a second curved mirror configured to receive the first reflected laser beam and generate a second reflected laser beam,
wherein the second reflected laser beam is focused onto a target location in a vessel of an EUV radiation source, wherein the vessel comprises a collector mirror,
wherein an angle between an optical axis of the second reflected laser beam and a horizontal axis is smaller than 25 degrees,
wherein the horizontal axis is defined by the optical axis of the collector mirror,
wherein the laser beam is received by one or more additional mirrors that redirect the laser beam towards the first curved mirror; and
wherein the one or more additional mirrors are configured to overcome a difference in location between the received laser beam and the redirected laser beam, and to translate the laser beam in a substantially vertical direction.

2. The laser focusing system of claim 1, wherein:
the first curved mirror is configured to receive the laser beam at an incidence angle that is smaller than 30 degrees; and
the second curved mirror is configured to receive the laser beam at an incidence angle that is smaller than 30 degrees.

3. The laser focusing system of claim 1,
wherein the one or more additional mirrors comprises a periscope system.

4. The laser focusing system of claim 3, wherein:
the periscope system comprises a first periscope mirror configured to receive the laser beam and reflect the laser beam towards a second periscope mirror, and
the second periscope mirror is configured to reflect the laser beam towards the first curved mirror.

5. The laser focusing system of claim 3, wherein the periscope system and the first and second curved mirror are configured so that the laser beam that is redirected towards the first curved mirror, the first reflected laser beam, and the second reflected laser beam are configured in substantially a same plane.

6. The laser focusing system of claim 3, wherein the periscope system and the first and second curved mirror are configured so that the laser beam that is redirected towards the first curved mirror, the first reflected laser beam, and the second reflected laser beam are configured in substantially a different plane.

7. The laser focusing system of claim 1, wherein the one or more curved additional mirrors form a telescope system configured to change a diameter of the laser beam and/or to change a divergence of the laser beam.

8. The laser focusing system of claim 1, wherein:
the laser beam and the redirected laser beam define a first plane, and the first reflected laser beam and the second reflected laser beam define a second plane, the second plane being different from the first plane.

9. The laser focusing system of claim 8, wherein the first plane is substantially perpendicular to the second plane.

10. The laser focusing system of claim 8, wherein the second plane is non-perpendicular to the first plane.

11. The laser focusing system of claim 8, wherein the second plane is parallel to the first plane.

12. The laser focusing system of claim 8, wherein the laser beam that is redirected towards the first curved mirror is configured in both the first plane and the second plane.

13. The laser focusing system of claim 8, wherein the laser beam that is redirected towards the first curved mirror is not configured in the second plane.

14. The laser focusing system of claim 1, wherein the angle between the optical axis of the second reflected laser beam and the horizontal axis is smaller than 20 degrees.

15. A laser source comprising:
a laser focusing system configured to be used in the EUV radiation source, the laser focusing system comprising:
a first curved mirror configured to receive a laser beam from a beam delivery system and generate a first reflected laser beam; and
a second curved mirror configured to receive the first reflected laser beam and generate a second reflected laser beam,
wherein the second reflected laser beam is focused onto a target location in a vessel of the EUV radiation source, wherein the vessel comprises a collector mirror,
wherein an angle between an optical axis of the second reflected laser beam and a horizontal axis is smaller than 25 degrees,
wherein the horizontal axis is defined by the optical axis of the collector mirror,
wherein the laser beam is received by one or more additional mirrors that redirect the laser beam towards the first curved mirror; and
wherein the one or more additional mirrors are configured to overcome a difference in location between the received laser beam and the redirected laser beam, and to translate the laser beam in a substantially vertical direction.

16. The laser source of claim 15, wherein the angle between the optical axis of the second reflected laser beam and the horizontal axis is smaller than 20 degrees.

17. An EUV radiation source comprising:
a laser source comprising:
a laser focusing system configured to be used in the EUV radiation source, the laser focusing system comprising:
a first curved mirror configured to receive a laser beam from a beam delivery system and generate a first reflected laser beam; and
a second curved mirror configured to receive the first reflected laser beam and generate a second reflected laser beam, wherein the second reflected laser beam is focused onto a target location in a vessel of the EUV radiation source, wherein the vessel comprises a collector mirror, wherein an angle between an optical axis of the second reflected laser beam and a horizontal axis is smaller than 25 degrees, wherein the horizontal axis is defined by the optical axis of the collector mirror, wherein the laser beam is received by one or more additional mirrors that redirect the laser beam towards the first curved mirror; and wherein the one or more additional mirrors are configured to overcome a difference in location between the received laser beam and the redirected laser beam, and to translate the laser beam in a substantially vertical direction.

18. The EUV radiation source of claim 17, wherein the angle between the optical axis of the second reflected laser beam and the horizontal axis is smaller than 20 degrees.

\* \* \* \* \*

UNITED STATES PATENT AND TRADEMARK OFFICE
CERTIFICATE OF CORRECTION

| | |
|---|---|
| PATENT NO. | : 12,007,693 B2 |
| APPLICATION NO. | : 17/600763 |
| DATED | : June 11, 2024 |
| INVENTOR(S) | : Beerens et al. |

It is certified that error appears in the above-identified patent and that said Letters Patent is hereby corrected as shown below:

In the Specification

In Column 1, Line 56, delete "$\lambda$" and replace with --$\lambda$,--.

In Column 3, Line 23, delete "target." and replace with --target;--;

In Column 3, Lines 31-32, delete "implemented." and replace with --implemented;--.

In Column 7, Line 2, delete "ay" and replace with --may--.

In Column 9, Line 14, delete "Unites" and replace with --United--.

In Column 11, Line 5, delete "an" and replace with --a--;

In Column 11, Line 7, delete "that that" and replace with --that--.

In Column 18, Line 59, delete "e g" and replace with --e.g.--.

In Column 22, Line 48, delete "a" and replace with --an--.

In Column 24, Line 58, delete "M N." and replace with --M $\neq$ N.--.

In the Claims

In Column 26, Claim 7, Line 6, after "or more" delete "curved";

In Column 26, Claim 15, Line 31, delete "the" and replace with --a--.

Signed and Sealed this
Twenty-third Day of July, 2024

*Katherine Kelly Vidal*
Katherine Kelly Vidal
*Director of the United States Patent and Trademark Office*